United States Patent [19]

Wilson et al.

[11] Patent Number: 5,612,576
[45] Date of Patent: Mar. 18, 1997

[54] SELF-OPENING VENT HOLE IN AN OVERMOLDED SEMICONDUCTOR DEVICE

[75] Inventors: Howard P. Wilson; Fonzell D. J. Martin, both of Austin, Tex.

[73] Assignee: Motorola, Schaumburg, Ill.

[21] Appl. No.: 960,337

[22] Filed: Oct. 13, 1992

[51] Int. Cl.$^6$ .................................................. H01L 23/29
[52] U.S. Cl. ....................... 257/788; 257/787; 257/790; 257/793
[58] Field of Search ............................... 257/666, 667, 257/678, 680, 683, 699, 701, 702, 787, 788, 790, 793, 796, 798, 676, 693, 684; 337/247, 297, 232, 166, 290, 273

[56] References Cited

U.S. PATENT DOCUMENTS

| | | | |
|---|---|---|---|
| 2,636,062 | 4/1953 | Colton | 257/683 |
| 3,553,542 | 1/1971 | Netherwood | 257/683 |
| 3,573,565 | 4/1971 | Grunert et al. | 257/683 |
| 4,274,106 | 6/1981 | Ohdate | 257/683 |
| 4,777,520 | 10/1988 | Nambu et al. | 257/793 |
| 4,866,506 | 9/1989 | Nambu et al. | 257/667 |
| 4,942,454 | 7/1990 | Mori et al. | 257/676 |
| 5,105,259 | 4/1992 | McShane et al. | 257/796 |
| 5,208,467 | 5/1993 | Yamazaki | 257/790 |
| 5,218,234 | 6/1993 | Thompson et al. | 257/787 |

FOREIGN PATENT DOCUMENTS

| | | | |
|---|---|---|---|
| 6256590 | 9/1988 | Japan | 257/667 |
| 64325970 | 8/1991 | Japan | 257/683 |

*Primary Examiner*—Carl W. Whitehead
*Attorney, Agent, or Firm*—Minh-Hien N. Clark

[57] ABSTRACT

A self-opening vent hole semiconductor device (10) can be manufactured to reduce the risk of popcorning during solder reflow. The device contains a semiconductor die (22) mounted on a die mounting area (15) of a substrate (12). A venting hole (16) is approximately centrally located in the die mounting area. A venting hole sealing cap (20) covers and seals the venting hole. A layer of patterned solder resist (18) adheres to a lower surface of the substrate. The venting hole sealing cap can be made from the layer of solder resist, and can be configured to be either physically isolated from the solder resist layer or physically partially connected to the solder resist layer. The venting hole sealing cap is designed to be a weakest interface within the device so that it self-opens upon an internal pressure less than a destructive pressure to the device. Solder balls (30) provide external electrical connections for the device.

12 Claims, 1 Drawing Sheet

SELF-OPENING VENT HOLE IN AN OVERMOLDED SEMICONDUCTOR DEVICE

CROSS REFERENCE TO RELATED APPLICATION

Related subject matter is disclosed in U.S. Patent application by Bruce Freyman et al., entitled "Moisture Relief for Chip Carrier," Ser. No. 726,660, filed Jul. 8, 1991 and assigned to the assignee hereof.

FIELD OF THE INVENTION

The present invention relates to semiconductor devices in general, and more specifically to resin overmolded pad array carriers with vent holes.

BACKGROUND OF THE INVENTION

Plastic encapsulated semiconductor devices are susceptible to moisture ingress due to the permeable nature of plastic molding compounds and printed circuit (PC) board substrate materials. The amount of moisture that a plastic resin encapsulated semiconductor device absorbs from its environment is dependent on several factors: the length of exposure time to the environment, the moisture level in the environment, the diffusivity of the plastic or how quickly moisture can be absorbed into the material, the solubility coefficient of the plastic or its saturation capacity, and the thickness of the plastic body on the device. Devices containing moisture levels exceeding some critical amount run the risk of cracking, delaminating, or "popcorning" during the rapid heating of the solder reflow operation associated with board mounting of devices because the moisture inside the device will vaporize causing a rapid increase in vapor pressure internal to the device.

Semiconductor devices which are subject to popcorning are normally baked in an oven at approximately 125° C., a typical temperature, for a predetermined length of time to drive moisture out of the devices before they are shipped to the customer. Those devices that are deemed to be moisture sensitive are packaged in "dry-packs" after baking to ensure that they are protected from moisture thereafter and will arrive dry at the customer site. Otherwise, devices that have absorbed a certain level of moisture run the risk of popcorning during the solder reflow operation. Mechanical failure of the semiconductor devices often times lead to subsequent electrical failure of these same devices due to thermal and mechanical stresses induced on the devices during their operation.

Current dry-packing practices involve baking semiconductor devices until dry, placing them into a dry-pack bag with desiccant packets and a humidity indicator card, vacuum sealing the bag immediately thereafter, and shipping the devices to the customer in these dry-packs. Typically, devices remain in a dry-pack bag until they are needed for board mounting. Once devices are removed from the dry-pack bag, they must be board mounted within a limited time to ensure that they have not reabsorbed enough moisture from the environment to popcorn during solder reflow. This time limitation is disadvantageous because it restricts the time window for the user to board mount all of the devices shipped in one dry-pack bag. If the time limit is exceeded, then the devices that have not yet been board mounted have to be rebaked to ensure that they will not popcorn during the solder reflow operation.

One type of plastic semiconductor device that is very susceptible to the popcorn phenomena is an overmolded pad array carrier (also known as ball grid array or BGA) semiconductor device. These devices are more prone to popcorning than other plastic encapsulated devices such as plastic dual-in-line packages (PDIPs), quad flat packs (QFPs), plastic leaded chip carriers (PLCCs), etc. The reason for this susceptibility is that these overmolded devices are thin, and are composed of organic materials that allow rapid moisture diffusion into the package.

The general construction of an overmolded pad array carrier has a semiconductor die mounted on an upper surface of a substrate and a plurality of solder balls attached to a lower surface of the substrate. The semiconductor die is overmolded with an encapsulating resin material which forms a package body on the upper surface of the substrate. The substrate is a PC board material, such as BT resin clad with copper. A vent hole can be placed in the bottom of the package underneath the die to act as a pressure relief path for moisture vapor. This vent hole is desirable because it has been shown to reduce the incidence of package popcorning during solder reflow. However, implementing a manufacturable process for assembling an overmolded leadless pad array carrier with a vent hole has not been practical or easy because of inherent complications with the design.

One problem with the vent hole concept is that the hole is located approximately in the center of the die mounting area of the substrate. The problem arises in the step of mounting the die on the substrate. The adhesive typically used to mount the die is a silver filled epoxy paste, which will flow into the vent hole unless somehow controlled. It is not desirable to have this adhesive paste fill the vent hole because it defeats the function of the vent hole which is to provide a pressure relief path for moisture. Furthermore, the adhesive paste can also contaminate the substrate, especially the solder pads on the lower surface of the substrate which could cause solderability problems when attaching the plurality of solder bumps to the substrate. Therefore, to prevent adhesive paste from flowing into the vent hole, the vent hole must be sealed during the die mounting process. If the vent hole is sealed, then the adhesive paste cannot flow into the vent hole during the die mounting process because air is trapped inside the vent hole due to the seal.

However, to have the vent hole function as intended, the seal must be removed, punctured or broken after the die mounting process step. Only if the seal is broken will there be a channeled pressure relief path for moisture to prevent the overmolded pad array carrier from popcorning during board mounting. Currently, the only methods for breaking this seal on the vent hole are either mechanical piercing or laser drilling, both of which have major disadvantages.

A disadvantage with the mechanical piercing method is that the vent hole is very small; therefore precise locating of the vent hole is required to prevent damage to the device during the piercing operation. This method is difficult to implement in a production environment because the machine parameters have to be tightly controlled at all times to ensure accurate piercing location and depth of piercing.

Although laser drilling can accurately open the vent hole seal consistently, the cost of implementing laser drilling is prohibitive. Laser drilling is a highly expensive, capital intensive method just to open a vent hole seal. Moreover, the laser drilling equipment requires a lot of floor space on the production floor which can be difficult to accommodate.

Another disadvantage to either proposed method for opening the vent hole seal is that both methods constitute an additional operation in the assembly of the overmolded pad array carrier with a vent hole. An added assembly operation translates into longer production cycle time and increased cost in the device. There is also a possibility for yield loss due to the extra operation. Furthermore, a sampled inspection of the devices must be implemented after this operation which is another non-value added operation.

SUMMARY OF THE INVENTION

In accordance with the invention, there is provided a method for manufacturing a self-venting semiconductor device having a substrate, a layer of patterned solder resist, a vent hole sealing cap, a semiconductor die, a package body, and a plurality of external electrical connections. The substrate has first and second surfaces, a pattern of conductive traces on at least one surface of the substrate, a die mounting area, and a vent hole approximately centrally located in the die mounting area. The layer of patterned solder resist adheres to the second surface of the substrate with a first adhesive force to the substrate. The vent hole sealing cap covers and seals the vent hole on the second surface of the substrate with a second adhesive force. The semiconductor die is bonded to the first surface of the substrate on the die mounting area with an adhesive having a third adhesive force between the semiconductor die and the die mounting area of the substrate. The semiconductor die is electrically connected to the pattern of conductive traces on the substrate. The package body is formed by an encapsulating material covering at least the semiconductor die and a portion of the pattern of conductive traces on the first surface of the substrate, wherein the encapsulating material has a fourth adhesive force to the substrate. The plurality of external electrical connections to the semiconductor die is electrically connected to the pattern of conductive traces. The first, third, and fourth adhesive forces are stronger than the second adhesive force, thus making the vent hole sealing cap a weakest interface in the self-opening vent hole semiconductor device such that the vent hole sealing cap automatically breaks away from the vent hole at a vapor pressure that is less than a destructive pressure to the semiconductor device. Also in accordance with the invention, there is provided a self-opening vent hole semiconductor device having those aforementioned characteristics.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
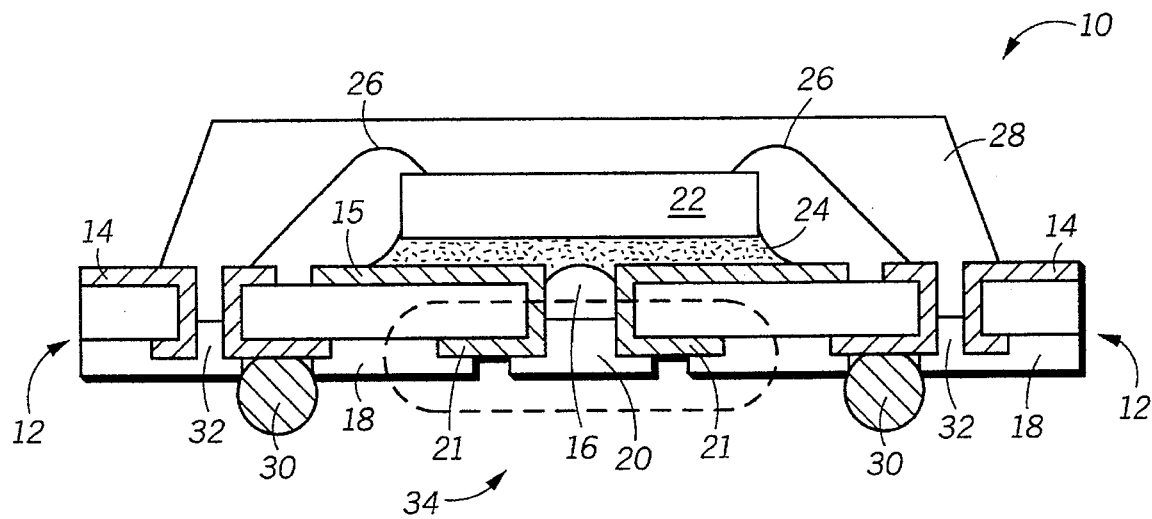
FIG. 1 illustrates, in cross section, a self-opening vent hole overmolded pad array carrier semiconductor-device, an embodiment of the present invention.

The invention will now be discussed with reference to the figures. Illustrated in FIG. 1 is a cross-sectional view of a self-opening vent hole overmolded pad array carrier semiconductor device 10. Device 10 is manufactured following the subsequent process steps. A substrate 12 is provided having a pattern of conductive traces 14, a vent hole 16 approximately centrally located in a die mounting area 15 of the substrate 12, a layer of patterned solder resist 18 on a lower surface of the substrate, and a vent hole sealing cap 20 that covers and seals the vent hole 16. Vent hole 16 is illustrated in this embodiment to be a plated through-hole structure although it is not required in practicing the invention. Part of the structure of the vent hole 16 has an annular metal land 21 surrounding the hole on the lower surface of the substrate 12. The annular metal land 21 is illustrated to be continuous with the plating of the through-hole. Vent hole sealing cap 20 covers a portion of the annular metal land 21. Vent hole sealing cap 20 can be, but is not limited to, the same solder resist material as the layer of patterned solder resist 18. Substrate 12 is typically made from a polymeric material, such as a printed circuit (PC) board material, for example, a bismaleimide-triazine (BT) resin, a fire retardant epoxy resin / glass cloth laminate (FR-4), or a flexible film.

Further illustrated in FIG. 1 is a semiconductor die 22 is mounted on the die mounting area 15 of the substrate 12 and is bonded to that area with an adhesive 24. Adhesive 24 is not limited to any particular type of adhesive, but it is typically a silver-filled epoxy paste. However, other adhesive materials can be used, such as a B-stage epoxy, a silver-filled polyimide, or a cyanoacrylate. Because the vent hole 16 is covered and sealed with vent hole sealing cap 20, adhesive 24 will not flow into the vent hole 16 during the die bonding/mounting process. A positive air pressure is maintained inside the sealed vent hole 16 which prevents a viscous adhesive, such as an epoxy paste, from filling the vent hole 16. The semiconductor die 22 is electrically connected to the pattern of conductive traces 14 with plurality of wire bonds 26 using conventional wire bonding equipment. A package body 28 is overmolded onto the upper surface of the substrate to cover the semiconductor die 22, the wire bonds 26, and a portion of the pattern of conductive traces 14. Package body 28 can be formed from, but is not limited to, a polymeric molding compound, for example an epoxy resin molding compound. The overmolding operation can be performed using conventional transfer molding equipment.

A plurality of solder balls 30 is attached to the lower surface of the substrate 12. The solder balls 30 are electrically connected to the pattern of conductive traces 14, thus providing external electrical connections for the semiconductor die 22. In this embodiment, the plurality of solder balls 30 are also physically connected to the pattern of conductive traces 14 on the lower surface of the substrate 12, but other methods of electrical routing may be possible wherein the solder balls are not physically connected but yet are electrically connected to the conductive traces. Electrical continuity is maintained between the upper and lower surfaces of the substrate 12 by way of a plurality of plated through-holes 32. In this illustration, the layer of patterned solder resist 18 has been configured to expose portions of the pattern of conductive traces 14 on the lower surface of the substrate 12 so that the solder balls 30 can be soldered directly to the exposed portions of the conductive traces 14.

Advantages to the manufacturing process and resulting semiconductor device structure 10 disclosed above will become apparent with the following discussion. In an overmolded pad array carrier semiconductor device, the most amount of moisture in a device that is not dry tends to concentrate in the die bond epoxy or adhesive region. For this reason, popcorning of these overmolded devices normally initiates from the adhesive region. Having a vent hole 16 to channel the path of moisture from the adhesive region 24 out of the device in 10 a controlled manner greatly reduces the possibility of popcorning for these devices. It is advantageous to centrally locate the vent hole 16 in the die mounting area 15 of the substrate 12 so that a mounted semiconductor die 22, and thus the adhesive 24, will be situated above the vent hole 16.

In the present invention, the vent hole sealing cap 20 is the designed to be a weakest interface in the self-opening vent hole overmolded pad array carrier semiconductor device 10 so that the vent hole sealing cap 20 automatically breaks away from the vent hole 16 at a vapor pressure that is less than a destructive pressure to the semiconductor device 10. In other words, during a solder reflow operation such as one associated with board mounting, if the overmolded leadless pad array carrier semiconductor device 10 undergoes thermal and stress conditions conducive to popcorning, the vent hole sealing cap 20 will break to act as a pressure relief valve for the device. The sealed vent hole 16 will self-open before any other interface in the device will separate. Examples of other interfaces are the interface between the package body 28 and the substrate 12 and the interface between the layer of solder resist 18 to the PC board material of the substrate 12. If the vapor pressure is released in a way that is not destructive to the device 10, then the device 10 will not popcorn. The self-opening vent hole 16 serves to channel the moisture out of the adhesive region which has been known to be an initiation site for popcorning of a device.

A major advantage to this self-opening vent hole design is that no mechanical piercing or laser drilling of the vent hole seal is required. The vent hole 16 will self-open if and only if the device 10 contains moisture that needs to be vented. If the device 10 is dry or does not have enough moisture in it to cause a popcorning problem during board mounting, then the vent hole 16 remains sealed because the vent hole sealing cap 20 will not break away. The condition of the device 10 after board mounting can give an indication of whether the device 10 has experienced stresses associated with popcorning. This information could be useful for pinpointing or excluding problem sources, especially if the device 10 experiences electrical failure.

Figure 2:
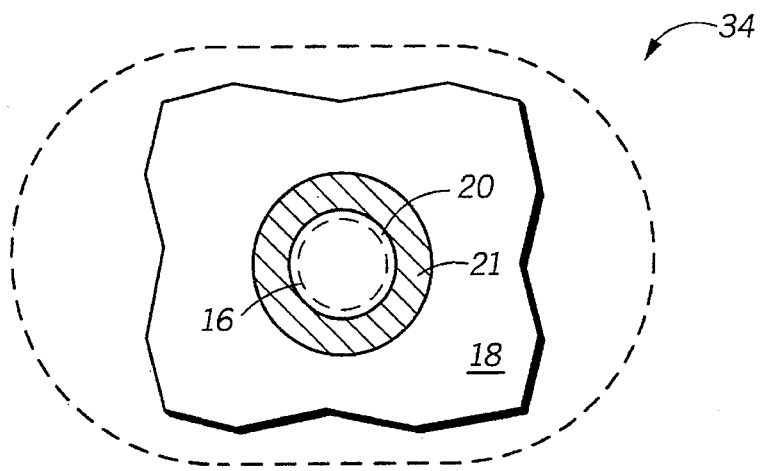
FIG. 2 illustrates, in a partial bottom view of the dotted line region of FIG. 1, a vent hole sealing cap that is physically isolated from a layer of patterned solder resist on a bottom surface of the device of FIG. 1, in an embodiment of the invention.

Several possible vent hole sealing cap configurations will now be discussed. FIG. 2 illustrates, in a partial bottom view of the device of FIG. 1, the vent hole region on the lower surface of the substrate 12 corresponding to the dotted line region 34 in FIG. 1. As illustrated in FIG. 2, the vent hole sealing cap 20 is completely isolated from the layer of patterned solder resist 18. Vent hole sealing cap 20 is larger than the vent hole 16 so that it completely covers the vent hole 16 to prevent a pressure leak. Vent hole sealing cap 20 covers and adheres to a portion of the annular metal land 21. The adhesive force between vent hole sealing cap 20 and the annular metal land 21 is less than the adhesive force of the layer of patterned solder resist 18 to the PC board substrate material, such that the vent hole sealing cap 20 and annular metal land 21 interface is weaker than the layer of solder resist 18 to PC board material interface. This particular characteristic is desirable because the vent hole sealing cap is intended to be the weakest structural link in the device.

Figure 3:
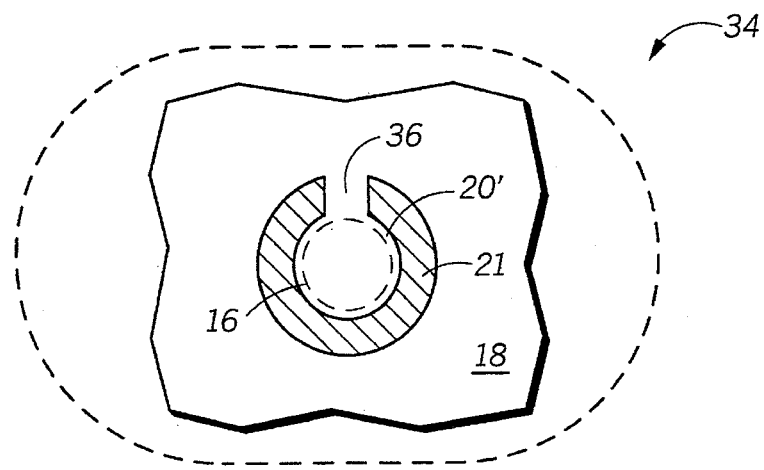
FIG. 3 illustrates, in a partial bottom view of the dotted line region of FIG. 1, a vent hole sealing cap that is physically partially connected to a layer of patterned solder resist on a bottom surface of the device of FIG. 1, in an alternative embodiment of the invention.

FIG. 3 illustrates, in a partial bottom view of the device of FIG. 1, an alternative configuration for the vent hole sealing cap 20' in the vent hole region on the lower surface of the substrate 12 corresponding to the dotted line region 34 in FIG. 1. As illustrated in FIG. 3, the vent hole sealing cap 20' is physically partially connected to the layer of patterned solder resist 18 with a tab 36. Vent hole sealing cap 20' is larger than the vent hole 16 so that it completely covers the vent hole 16 to prevent a pressure leak. Vent hole sealing cap 20' also covers and adheres to a portion of the annular metal land 21. The tab 36 keeps the vent hole sealing cap 20 from completely detaching from the device 10 when the vent hole sealing cap 20' self-vents. A reason why this might be desirable is that the tab 36 would prevent loose vent hole sealing caps from getting onto PC boards and cause possible contamination or damage.

Vent hole sealing cap 20 or 20' can be part of the layer of patterned solder resist 18, so that in effect, the vent hole sealing cap is made from a solder resist material. However, it is not a requirement that vent hole sealing cap 20 be made from the layer of solder resist 18. Nevertheless, it is convenient in practicing the invention to incorporate the vent hole sealing cap 20 or 20' with the layer of solder resist 18 for the following reasons.

In the construction/manufacturing of the substrate for an overmolded leadless pad array carrier semiconductor device, the copper clad PC board material is drilled to create through-holes or vias and other necessary holes such as tooling holes. A metal patterning process is performed next, wherein the copper cladding is etched away to produce a pattern of conductive traces on both upper and lower surfaces of the substrate.

The substrate is plated with copper, wherein copper is plated onto the pattern of conductive traces as well the sidewalls of the through-holes. After the copper plating, a thin layer of solder resist is applied over the upper and lower surfaces of the substrate. A resist patterning process is performed next, wherein the solder resist layer is etched away to reveal selective portions of the pattern of conductive traces. The exposed portions of the pattern of conductive traces are subsequently plated with nickel and gold.

The making of the vent hole sealing cap 20 or 20' can easily be incorporated into the process flow for the manufacturing of the substrate if the vent hole sealing cap 20 or 20' is made from solder resist. The layer of solder resist can be applied to the lower surface of the substrate in just the same manner as the old process. However, in the resist patterning process step, the layer of solder resist could be patterned to have that portion of solder resist underneath the vent hole 16 etched take on the desired configuration as illustrated in FIGS. 2 & 3.

In the illustration of FIG. 2, the vent hole sealing cap 20 is physically isolated from the layer of solder resist, so that if the vent hole 16 self-opens, the vent hole sealing cap 20 would be completely removed from the device 10.

In the illustration of FIG. 3, the vent hole sealing cap 20' is physically partially connected to the layer of solder resist 18 with a tab of solder resist 36. Thus, if the vent hole 16 self-opens, the vent hole sealing cap 20' would still be connected to the device 10. In that event, however, the vent hole sealing cap 20' would no longer be sealing the vent hole 16.

The foregoing description and illustrations contained herein demonstrate many of the advantages associated with the present invention. In particular, it has been revealed that a self-opening vent hole overmolded pad array carrier semiconductor device provides an elegant solution to a manufacturing problem of making a popcorning resistant overmolded leadless pad array carrier. The vent hole in the device is designed to be self-opening, thus eliminating a multitude of manufacturing problems which translates to a cost savings. No additional process steps, no new equipment, no capital investment, no increase in production cycle time is required to implement the invention. The vent hole sealing cap can be fabricated during the normal process steps of the PC board substrate manufacturing. No extra process step is even necessary at the substrate manufacturing level. The vent hole sealing cap can be etched at the same time as the patterning of the solder resist layer on the lower surface of the substrate. Moreover, by eliminating the need for an added process step to remove or puncture the vent hole sealing cap, the possibility for yield loss associated with any process step is prevented. And because the device now has built-in popcorning protection, the customer is not constrained by a short time limit to mount the devices onto a board. Furthermore, storage of these devices in a dry nitrogen storage cabinet (<5% relative humidity) at the customer site is not required since the devices are designed to self-open the vent hole if necessary.

Thus it is apparent that there has been provided, in accordance with The invention, a self-opening vent hole overmolded pad array carrier semiconductor device that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, a variation in the vent hole structure is possible. Some overmolded pad array carriers have thermal vias in the supporting substrate. In that instance, there is a large metal plane area around the thermal via. This metal area acts as a heat spreader and also as a ground plane for the device. This metal area could serve the function of the annular ring or metal land around the thermal via so that the resulting structure is similar to that of the vent hole illustrated in the figures. Additionally, patterns of conductive metal traces may vary from that illustrated, depending on the specific requirements of the semiconductor device. Furthermore, although the vent hole is illustrated to be plated, it is not a necessary condition if the processing of the substrate can be facilitated without plating the vent hole. Furthermore, the vent hole sealing cap is illustrated to be only large enough to cover and seal the vent hole, but it is possible to make the vent hole sealing cap larger so that is covers the entire annular metal land. Therefore, it is intended that this invention encompass all such variations and modifications as fall within the scope of the appended claims.

We claim:

1. A self-opening vent hole semiconductor device comprising:

a substrate having first and second surfaces, a die mounting; area, and a vent hole approximately centrally located in the die mounting area, the substrate being composed of an electrically insulative material and carrying a pattern of conductive traces on at least one surface of the substrate;

a vent hole sealing cap overlying the second surface of the substrate to cover and seal the vent hole in the substrate with a first adhesive force;

a semiconductor die mounted on the first surface of the substrate on the die mounting area with an adhesive having a second adhesive force between the semiconductor die and the die mounting area of the substrate, the semiconductor die being electrically connected to the pattern of conductive traces;

a package body formed by an encapsulating material covering the semiconductor die on the first surface of the substrate, wherein the package body and the vent hole sealing cap are composed of different materials and wherein the vent hole sealing cap is physically isolated from the package body, the encapsulating material having a third adhesive force to the substrate; and a plurality of external electrical connections to the semiconductor die, wherein the plurality of external electrical connections are electrically connected to the pattern of conductive traces;

wherein said second and third adhesive forces are stronger than said first adhesive force, thus making the vent hole sealing cap a weakest interface in the self-opening vent hole semiconductor device such that the vent hole sealing cap automatically breaks away from the vent hole at a vapor pressure that is less than a destructive pressure to the semiconductor device.

2. The semiconductor device of claim 1 wherein the vent hole sealing cap is composed of a solder resist material.

3. The semiconductor device of claim 2 wherein the vent hole sealing cap is physically partially connected by a tab of solder resist material to a layer of patterned solder resist adhering to the second surface of the substrate.

4. The semiconductor device of claim 1 wherein the vent hole further comprises an annular metal land on the second surface of the substrate surrounding a plated through-hole in the substrate.

5. A self-opening vent hole semiconductor device comprising:

a substrate having first and second surfaces, a thickness, a die mounting area, and a vent hole approximately centrally located in the die mounting area, wherein the vent hole extends through the thickness of the substrate, the vent hole comprising an annular metal land on the second surface of the substrate surrounding a plated through-hole in the substrate, the substrate being composed of an electrically insulative material and carrying a pattern of conductive traces on at least one surface of the substrate;

a vent hole sealing cap covering and sealing the vent hole in the substrate wherein the vent adheres to a portion of the annular metal land with a first adhesive force;

a semiconductor die mounted on the first surface of the substrate on the die mounting area with an adhesive having a second adhesive force between the semiconductor die and the die mounting area of the substrate, the semiconductor die being electrically connected to the pattern of conductive traces;

a package body formed by an encapsulating material covering the semiconductor die on the first surface of the substrate, wherein the package body and the vent hole sealing cap are composed of different materials and wherein the vent hole sealing cap is physically isolated from the package body, the encapsulating material having a third adhesive force to the substrate; and a plurality of solder balls electrically connected to the pattern of conductive traces to provide external electrical connections to the semiconductor die;

wherein said second and third adhesive forces are stronger than said first adhesive force, thus making the vent hole sealing cap a weakest interface in the self-opening vent hole semiconductor device such that the vent hole sealing cap automatically breaks away from the vent hole at a vapor pressure that is less than a destructive pressure to the semiconductor device.

6. The semiconductor device of claim 5 wherein the vent hole sealing cap is composed of a solder resist material.

7. The semiconductor device of claim 6 wherein the vent hole sealing cap is physically partially connected by tab of solder resist material to a layer of patterned solder resist adhering to the second surface of the substrate.

8. The semiconductor device of claim 5 wherein the substrate comprises a material selected from a group consisting of: a bismaleimide-triazine resin, an epoxy-glass, and a flexible film.

9. The semiconductor device of claim 5 wherein the semiconductor die is electrically connected the pattern of conductive traces by a plurality of wire bonds.

10. The semiconductor device of claim 5 wherein the adhesive comprises a material selected from a group consisting of: a silver-filled epoxy paste, a B-stage epoxy, a silver-filled polyimide, and a cyanoacrylate.

11. The semiconductor device of claim 1 wherein the substrate comprises a material selected from a group consisting of: bismaleimide-triazine resin, an epoxy-glass, and a flexible film.

12. The semiconductor device of claim 1 wherein the adhesive comprises a material selected from a group consisting of: a silver-filled epoxy paste, a B-stage epoxy, a silver-filled polyimide, and a cyanoacrylate.

* * * * *